US006351005B1

(12) United States Patent
Al-Shareef et al.

(10) Patent No.: US 6,351,005 B1
(45) Date of Patent: Feb. 26, 2002

(54) INTEGRATED CAPACITOR INCORPORATING HIGH K DIELECTRIC

(75) Inventors: Husam N. Al-Shareef, Boise; Er-Xuan Ping, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/579,821

(22) Filed: May 25, 2000

Related U.S. Application Data

(62) Division of application No. 09/156,545, filed on Sep. 17, 1998, now Pat. No. 6,124,164.

(51) Int. Cl.$^7$ .............................................. H01L 27/108
(52) U.S. Cl. ...................................... 257/306; 257/310
(58) Field of Search ................................. 257/296–310, 257/295, 528, 532; 438/240, 253, 396

(56) References Cited

U.S. PATENT DOCUMENTS

| | | | |
|---|---|---|---|
| 4,145,803 A | 3/1979 | Tasch, Jr. ................... | 438/250 |
| 4,481,283 A | 11/1984 | Kerr et al. .................. | 430/319 |
| 4,890,191 A | 12/1989 | Rokos ........................ | 361/313 |
| 5,037,773 A | 8/1991 | Lee et al. ................... | 438/255 |
| 5,053,917 A | 10/1991 | Miyasaka et al. ......... | 361/321.5 |
| 5,054,887 A | 10/1991 | Kato et al. .................. | 349/42 |
| 5,059,448 A | 10/1991 | Chandra et al. ............ | 427/557 |
| 5,099,305 A | 3/1992 | Takenaka .................... | 257/295 |
| 5,138,411 A | 8/1992 | Sandhu ....................... | 257/296 |
| 5,182,232 A | 1/1993 | Chhabra et al. ............ | 438/398 |
| 5,187,638 A | 2/1993 | Sandhu et al. ............. | 361/313 |
| 5,227,855 A | 7/1993 | Momose ..................... | 365/145 |
| 5,241,201 A | 8/1993 | Matsuo et al. .............. | 257/309 |
| 5,278,091 A | 1/1994 | Fazan et al. ................ | 438/398 |
| 5,293,510 A | 3/1994 | Takenaka .................... | 257/295 |
| 5,349,494 A | 9/1994 | Ando .......................... | 361/322 |
| 5,366,920 A | 11/1994 | Yamamichi et al. ........ | 438/396 |
| 5,369,296 A | 11/1994 | Kato .......................... | 257/295 |

(List continued on next page.)

FOREIGN PATENT DOCUMENTS

| | | |
|---|---|---|
| JP | 4-212449 | 8/1992 |
| JP | 6-061422 | 3/1994 |

OTHER PUBLICATIONS

Watanabe et al., "Hemispherical Grainer Si Formation on in–situ Phosphorus Doped Amorphous–Si Electrode for 256Mb DRAM's Capacitor", IEEE Transactions on Electron. Devices, vol. 42, No. 7, Jul. 1995, pp. 1247–1254.
Wolf and Tauber, Silicon Processing for the VLSI Era, vol. II, pp. 212–214.
Matsuo, et al., "Spread–Vertical–Capacitor Cell (SVC) for High–Density dRAM's", IEEE Transactions on Electron Devices, vol. 40, No. 4, Apr. 1993, pp. 750–754.

Primary Examiner—Eddie Lee
Assistant Examiner—George C. Eckert, II
(74) Attorney, Agent, or Firm—Knobbe, Martens, Olson & Bear LLP

(57) ABSTRACT

An integrated capacitor is provided, incorporating a high dielectric constant material. In a disclosed method, a high k capacitor dielectric is formed in the shape of a container above a protective layer. After the dielectric is formed, inner and outer electrodes are formed, representing storage and reference electrodes of a memory cell. Contact is separately made through the protective layer from a storage electrode layer, which lines the inner surface of the dielectric, to an underlying polysilicon plug. The contact can be a thin layer lining the interior of the storage electrode layer, or can completely fill the container capacitor. In the latter instance, the contact can form part of the storage electrode and contribute to capacitance of the cell. Volatile dielectric materials can thus be formed prior to the electrodes, avoiding oxidation of the electrodes and underlying polysilicon plug, while also minimizing oxygen depletion through diffusion from the high dielectric constant material.

19 Claims, 6 Drawing Sheets

U.S. PATENT DOCUMENTS

| | | | |
|---|---|---|---|
| 5,418,180 A | 5/1995 | Brown | 438/398 |
| 5,429,972 A | 7/1995 | Anjum et al. | 438/398 |
| 5,443,688 A | 8/1995 | Toure et al. | 438/3 |
| 5,444,013 A | 8/1995 | Akram et al. | 438/398 |
| 5,495,117 A | 2/1996 | Larson | 257/295 |
| 5,555,486 A | 9/1996 | Kingon et al. | 361/305 |
| 5,595,928 A | 1/1997 | Lu et al. | 438/253 |
| 5,612,082 A | 3/1997 | Azuma et al. | 427/96 |
| 5,622,883 A * | 4/1997 | Kim | 438/396 |
| 5,631,804 A | 5/1997 | New | 361/312 |
| 5,637,527 A * | 6/1997 | Baek | 438/396 |
| 5,793,076 A | 8/1998 | Fazan et al. | 257/298 |
| 5,869,860 A * | 2/1999 | Widmann et al. | 257/304 |
| 5,930,623 A * | 7/1999 | Wu | 438/253 |
| 5,940,713 A | 8/1999 | Green | 438/396 |
| 5,955,758 A * | 9/1999 | Sandhu et al. | 257/306 |
| 6,037,206 A * | 3/2000 | Huang et al. | 438/240 |
| 6,184,074 B1 * | 2/2001 | Crenshaw et al. | 438/238 |

* cited by examiner

INTEGRATED CAPACITOR INCORPORATING HIGH K DIELECTRIC

REFERENCE TO RELATED APPLICATION

The present application is a divisional of U.S. application Ser. No. 09/156,545, filed Sep. 17, 1998 U.S. Pat. No. 6,184,164.

FIELD OF THE INVENTION

The present invention relates generally to integrated semiconductor memory cell capacitors. In particular, the invention relates to methods and structures for fabricating memory cell capacitors incorporating high dielectric constant materials.

BACKGROUND OF THE INVENTION

A memory cell in an integrated circuit, such as a dynamic random access memory (DRAM) array, typically comprises a charge storage capacitor (or cell capacitor) coupled to an access device such as a Metal-Oxide-Semiconductor Field Effect Transistor (MOSFET). The MOSFET functions to apply or remove charge on the capacitor, thus effecting a logical state defined by the stored charge. The amount of charge stored on the capacitor is proportional to the capacitance, $C = k\epsilon_0 A/d$, where k is the dielectric constant of the capacitor dielectric, $\epsilon_0$ is the vacuum permittivity, A is the electrode area and d is the spacing between the electrodes.

Integrated circuits in general, including DRAMs, are continually being designed more densely in pursuit of faster processing speeds and lower power consumption. As the packing density of storage cells continues to increase, each cell must still maintain a certain minimum charge storage to ensure reliable operation of their memory cell. It is thus increasingly important that capacitors achieve a high stored charge per footprint or unit of chip area occupied.

Several techniques have recently been developed to increase the total charge capacity of the cell capacitor without significantly affecting the chip area occupied by the cell. These techniques include increasing the effective surface area of the electrodes by creating folding structures such as trench or stacked capacitors. Such structures better utilize the available chip area by creating three dimensional shapes to which the conductive electrodes and capacitor dielectric conform. The surface of the electrodes may be further increased by providing a roughened surface to the bottom electrode over which the capacitor dielectric and the top electrode are conformally deposited.

Other techniques concentrate on the use of new dielectric materials having higher dielectric constants (k). Such materials include tantalum oxide ($Ta_2O_5$), barium strontium titanate (BST), strontium titanate (ST), barium titanate (BT), lead zirconium titanate (PZT), and strontium bismuth tantalate (SBT). Such materials effectively possess dielectric constants significantly greater than conventional dielectrics (e.g., silicon oxides and nitrides). Whereas k equals 3.9 for silicon dioxide, the dielectric constants of these new materials can range from 20 to 40 (tantalum oxide) to 300 (SBT), and some even higher (600 to 800). Using such materials enables the creation of much smaller and simpler capacitor structures for a given stored charge requirement, enabling the packing density dictated by future generation circuit design.

Difficulties have been encountered, however, in incorporating these materials into fabrication process flows. For example, chemical vapor deposition of PZT and BST is conducted in a highly oxidizing ambient. Polycrystalline silicon capacitor plates are thus subject to oxidation during such deposition. The silicon dioxide formed in polysilicon electrodes has a much lower dielectric constant than the "high k" material, which drastically lowers the overall capacitance of the capacitor. Conventionally, the bottom electrode is first formed, followed by the high k dielectric material and then the top electrode.

To avoid such degradation in capacitance, electrodes can be made of noble metals, such as platinum. Unfortunately, oxygen easily diffuses through platinum electrodes and oxidizes underlying oxidation-susceptible elements, such as active areas of underlying transistors, or polysilicon or tungsten plugs used to contact such active areas. Oxidation of either the electrode or the underlying electrical elements reduces conductivity and slows circuit operation. Furthermore, high dielectric materials typically require an anneal step to cure the high dielectric material, such as by driving out carbon from organometallic precursors. During these high temperature steps, oxidation of adjacent elements reduces the oxygen content in the high dielectric material. If even a small percentage of the oxygen content is lost, highly conductive electrical paths can be formed through the dielectric constant material, leading to unacceptable levels of current leakage and failure of the memory cell.

The diffusion of oxygen through noble metal electrodes has led to the suggestion of using conductive diffusion barriers between the high dielectric material and the underlying polysilicon plug. Such barrier layers, however, have been difficult to integrate into the process flow, and furthermore have a tendency to break down during subsequent processing. Moreover, such conductive barrier layers have a limited width of necessity, since they must be isolated from one another across a memory array. Accordingly, oxygen can still diffuse the relatively short distance around such barrier layers to the underlying substrate or plug.

Thus, a need exists for a capacitor structure and a process flow for integrating high dielectric constant materials into memory cell capacitors. Desirably, such capacitors and process flows should avoid oxidation of underlying oxidizable structures and the chemical or physical breakdown of dielectric material itself.

SUMMARY OF THE INVENTION

In the illustrated embodiment, these needs are fulfilled by a process of forming an integrated capacitor whereby a high dielectric constant material is formed prior to formation of the electrodes. Oxidation of the electrodes and oxygen diffusion through the electrodes during dielectric formation is thereby avoided. Moreover, oxygen depletion from the high k material is minimized. The disclosed process flow also enables incorporation of a relatively thick diffusion barrier to prevent oxidation of underlying oxidizable elements, such as polysilicon plugs, during high k material formation.

Thus, in accordance with one aspect of the invention, a process for forming a capacitor in an integrated circuit is provided. The process includes forming an insulative protective layer above a circuit node, and a dielectric layer above the protective layer. After forming the dielectric layer, a first conductive layer is then formed on a first side of the dielectric layer. The first conductive layer is electrically connected to the circuit node through the protective layer.

In accordance with another aspect of the present invention, a method is provided for forming an integrated circuit having a memory cell capacitor. A high k dielectric layer is formed above a semiconductor substrate, which includes a transistor active area. After forming the dielectric layer, a storage electrode is formed, followed by forming a reference electrode.

In accordance with still another aspect of the invention, a process is disclosed for forming a memory cell capacitor in an integrated circuit. The process involves forming an insulating protective layer above a circuit node, and a structural layer above the protective layer. A via is etched into the structural layer, and then lined with a dielectric material having a high dielectric constant, thereby forming a dielectric container. This dielectric container is, in turn, lined with a first conductive layer. A spacer etch then extends through the dielectric container and the underlying protective layer, exposing the circuit node. A second conductive layer is deposited to electrically connect the first conductive layer to the circuit node. Upon removing the structural layer from outside the dielectric container, a third conductive layer is formed outside the dielectric container.

In accordance with still another aspect of the present invention, an integrated circuit is provided with a memory cell capacitor above a semiconductor substrate. An oxidizable conductive plug extends from the substrate to a first level, and an insulating protective layer has a thickness of at least about 500 Å above the first level. A container-shaped dielectric layer is formed above the insulating protective layer. An inside surface of the dielectric layer is lined with a first conductive layer, while a second conductive layer directly contacts the first conductive layer and extends through the protective layer to electrically contact the conductive plug. A third conductive layer lines an outside surface of the dielectric container.

In accordance with another aspect of the invention, a system having an integrated capacitor over a semiconductor substrate includes an oxidizable circuit node. The system further includes a capacitor dielectric layer characterized by a dielectric constant of greater than about 30. A reference electrode directly contacts one side of the dielectric layer. An oxidation-resistant conductive layer directly contacts both the opposite side of the dielectric layer and the oxidizable circuit node.

BRIEF DESCRIPTION OF THE DRAWINGS

These and other aspects of the invention will be apparent to the skilled artisan from the following detailed description read in conjunction with the appended drawings, which are meant to illustrate, and not to limit, the invention, and in which:

FIGS. 5a–8a illustrate the partially fabricated integrated circuit of FIG. 4 after sequential process steps in accordance with a first preferred embodiment; and FIGS. 5b–8b illustrate the partially fabricated integrated circuit of FIG. 4 after sequential process steps in accordance with a second preferred embodiment.

DETAILED DESCRIPTION OF THE PREFERRED EMBODIMENTS

The preferred embodiments describe processes of forming integrated capacitors, incorporating high k dielectrics, above a polysilicon plug in a DRAM fabrication. The skilled artisan will understand, however, that the methods and structures disclosed herein will have application to formation of capacitor structures in integrated circuits generally.

Figure 1:
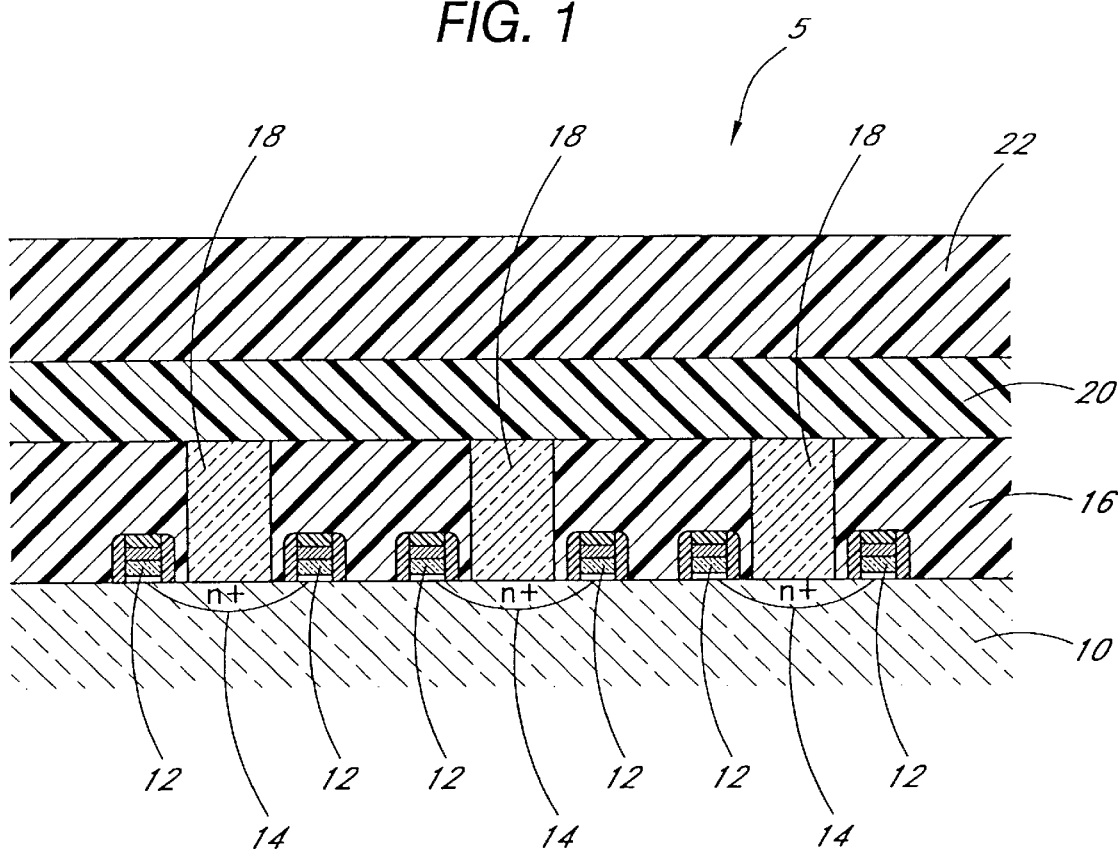
FIG. 1 is a schematic cross-sectional view of a partially fabricated integrated circuit formed upon a semiconductor substrate, constructed in accordance with preferred embodiments of the present invention.

FIG. 1 illustrates a partially fabricated integrated circuit 5, formed within and over a semiconductor substrate 10, in accordance with the preferred embodiments. While the illustrated substrate comprises an intrinsically doped monocrystalline silicon wafer, it will be understood by one of skill in the art of semiconductor fabrication that the "substrate" in other arrangements can comprise other forms of semiconductor layers which include active or operable portions of semiconductor devices.

In the illustrated embodiment, a plurality of transistor gate electrodes 12 overlie the substrate 10, adjacent active areas 14 within the substrate 10. Several elements which are not relevant to the discussion here, such as field oxide elements to isolate the active areas of different transistors, are omitted for simplicity. The width of each gate is preferably less than about 0.25 µm for current and future generation integrated circuits. For a given circuit design, the gate width is referred to as the "resolution" or "critical dimension." As integrated circuit design is continuously scaled down, generations are typically identified by reference to this critical dimension. Scaling of the gate width leads to smaller footprints available for capacitor plates, deeper, more narrow contacts, smaller metal line widths and spacing, etc.

A first insulating layer 16 is shown covering the gate electrodes 12. Generally, this insulating layer 16 comprises a form of oxide, such as borophosphosilicate glass (BPSG). Depending upon the presence or absence of other circuit elements, the first insulating layer 16 has a thickness between about 0.5 µm to 1.0 µm. For example, certain DRAM circuit designs call for "buried" digit lines running below the cell capacitors, such that a thicker insulating layer is required to electrically isolated the digit line from the underlying transistors and the overlying capacitors.

As also shown in FIG. 1, a plurality of vias have been formed through the first insulating layer 16 and filled with conductive material to electrically contact active areas 14 between the gates 12. Such conductive contacts can comprise tungsten or silicide plugs. In the illustrated embodiment, the material comprises conductively doped polycrystalline silicon, which advantageously can be deposited into deep, narrow contact vias with good step coverage by chemical vapor deposition (CVD), and furthermore exhibit a very high melting point to withstand further front-end high temperature processing. In accordance with industry terminology, the conductive contacts shall be referred to as "poly plugs" 18, though it will be understood that other materials (e.g., tungsten or silicide) can also be used for this purpose. Typically, the poly plugs 18 have the same width as the gate electrodes 12.

A second insulating layer 20 is formed over the first insulating layer 16 and the poly plugs 18. Desirably, the second insulating layer 20 is thick enough to act as at least a partial barrier to oxygen diffusion from above the layer 20 to the underlying poly plugs 18 and can therefore be considered a protective layer. In the illustrated embodiment, the protective layer 20 comprises an oxide formed from tetraethylorthosilicate, or TEOS, which is slightly more dense than BPSG. Preferably, the TEOS protective layer 20 is greater than about 500 Å, more preferably greater than about 1,500 Å, and most preferably between about 2,000 Å and 3,000 Å.

A structural layer 22 is then formed over the protective layer 20. As will be better understood from the methods described below, this layer 22 need not become a permanent part of the circuit. Accordingly, the skilled artisan has a great deal of flexibility in the selection of this material. Advantageously, however, the structural layer 22 should be inexpensive and selectively etchable relative to the underlying second insulating layer 20 (TEOS in the preferred embodiment). In the illustrated embodiment, the structural layer 22 comprises BPSG. The capacitance of the capacitor being fabricated is influenced by the thickness of this structural layer 22. For the illustrated circuit, using 0.25 $\mu$m resolution, the structural layer 22 preferably has a thickness of greater than about 1.0 $\mu$m, more preferably between about 1.0 $\mu$m and 2.0 $\mu$m.

Figure 2:
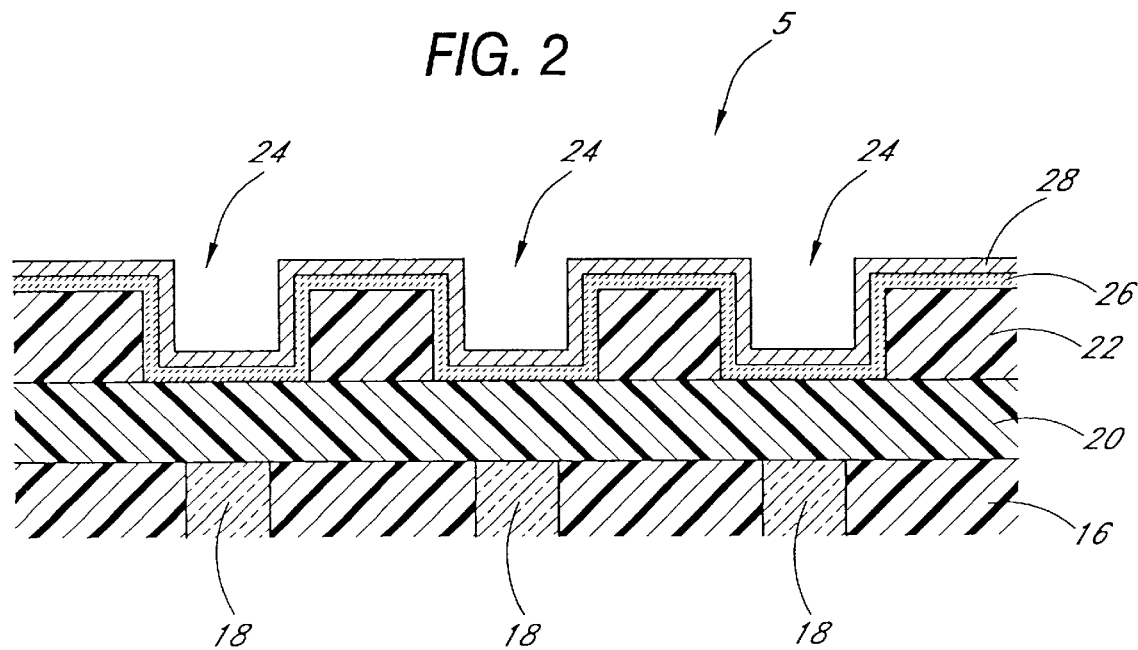
FIGS. 2–4 illustrate the partially fabricated integrated circuit of FIG. 1 after sequential process steps which are common to two preferred embodiments.

FIG. 2 illustrates the product of an etch step, followed by two depositions. A plurality of vias 24 are first etched through the structural layer 22. Preferably, the etch is selective against the underlying insulating material 20, and is performed through a mask having openings approximately two times the gate width, or about 0.5 $\mu$m in the illustrated embodiment.

A capacitor dielectric 26 is then formed over the structural layer 22 and into the vias 24. Preferably, the capacitor dielectric 26 comprises a high dielectric constant (high k) material. "High k" materials are to be distinguished from conventional dielectric materials such as silicon dioxide (k≈3.9), and refers herein to materials having dielectric constants greater than about 20. As noted in the Background section above, such materials include ferro-electric materials (e.g., PZT or SBT), other complex oxides (e.g., BST, BT, ST), and other materials having dielectric constants considerably higher than that of silicon dioxide (e.g., tantalum oxide). In the illustrated embodiment, the capacitor dielectric 26 comprises BST ($Ba_xSr_{1-x}TiO_3$), which can advantageously be formed by chemical vapor deposition (CVD), wherein volatile reactants containing barium, strontium, and titanium are introduced into a CVD chamber along with an oxygen ambient.

In particular, in an exemplary deposition, organometallic precursors incorporating tetramethyl heptanedionate (thd) are reacted in a highly oxidizing environment within a processing chamber. These precursors comprise $Ba(thd)_2$, $Sr(thd)_2$, and $Ti(isoproproxy)_2(thd)_2$, or $Ti(O-i-Pr)_2(thd)_2$. The substrate 10 is preferably heated to about 600° C. to 700° C., while the chamber pressure can be between about 100 mTorr to 10 Torr. The deposited layer is then cured in an anneal, preferably at about 550° C. in an oxygen-containing ambient. An exemplary ambient is $O_2$ and $N_2O$ at pressures of greater than about 100 mTorr. The skilled artisan will understand that this anneal can alternatively be conducted at a later stage in processing, such as after an isolation etch back, as discussed in more detail below. Preferably, the BST 26 has a thickness between about 50 Å and 500 Å, and more preferably between 100 Å and 300 Å.

A conductive layer 28 is then deposited over the capacitor dielectric 26. Preferably, the conductive layer 28 comprises an oxidation-resistant material, such as a conductive oxide or noble metal. In the illustrated embodiment, the conductive layer 28 comprises sputtered platinum having a preferred thickness between about 100 Å and 500 Å.

Figure 3:
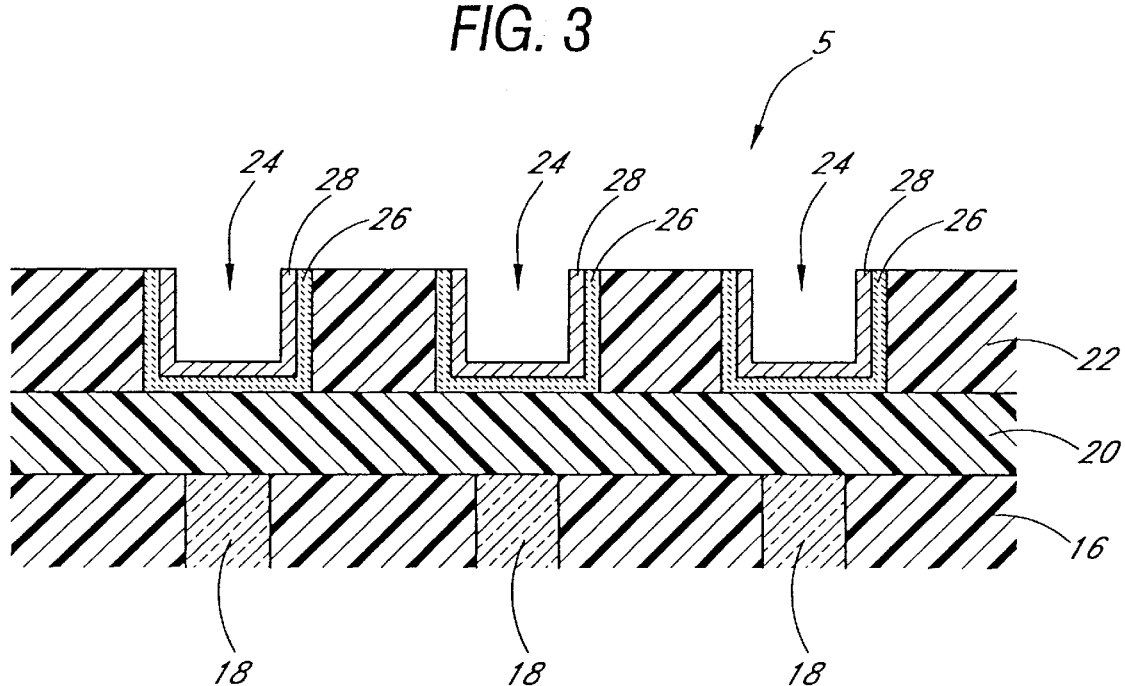

With reference now to FIG. 3, the portions of the capacitor dielectric 26 and conductive layer 28 within the vias 24, are then isolated from one another across the array. As will be better understood from the description below, this isolation may be accomplished by a spacer etch which would simultaneously expose the structural layer at the bottom of the vias. In the illustrated embodiment, however, the isolation is separately performed by planarization, and more particularly by chemical mechanical planarization (CMP). As will be understood by the skilled artisan, such planarization involves filling the vias 24 with a structural material, typically photoresist, inverting the substrate over an abrasive pad containing a slurry with chemical etchants, and abrading the top surface of the wafer physically with the aid of chemical reactions, as is well known by the skilled artisan. After the CMP is completed, the filler can be stripped, leaving the structure shown in FIG. 3.

Figure 4:
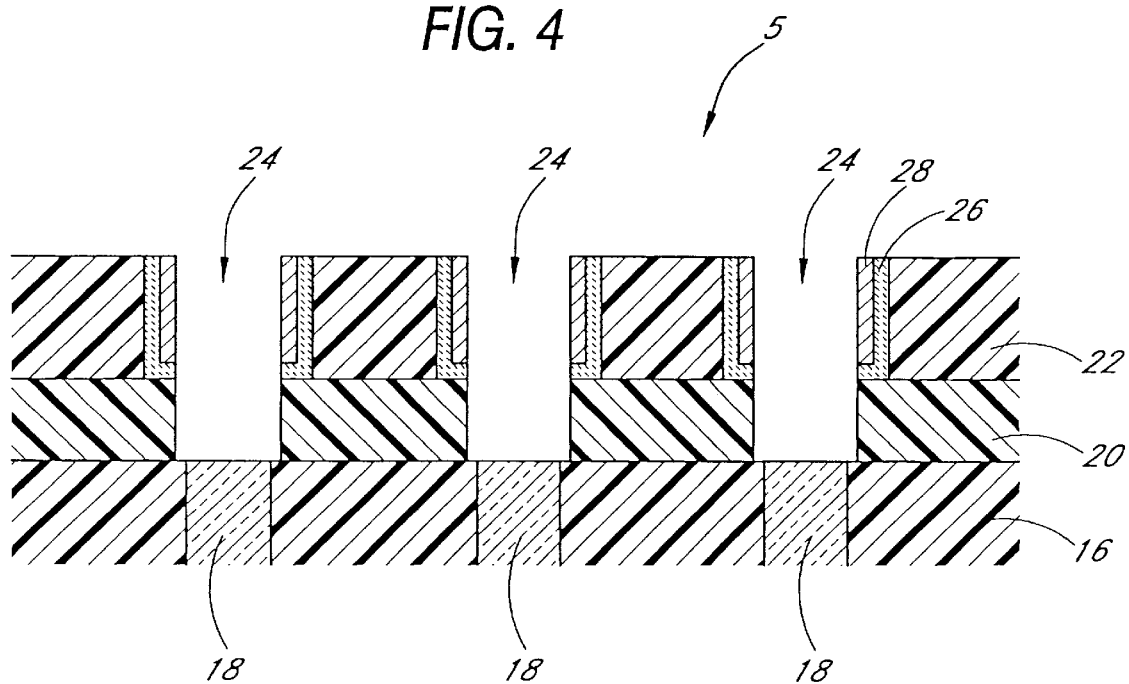

With reference now to FIG. 4, after the isolation planarization, the vias 24 are extended down to expose the conductive elements 18 below. In the illustrated embodiment, these conductive elements comprise poly plugs 18, which are highly oxidizable. However, as the high dielectric capacitor material 26 has already been formed and cured at this point in the process, poly plugs 18 are no longer subject to the highly oxidizing atmosphere present in the formation of the capacitor dielectric 26.

The preferred process initially removes horizontal portions of the conductive layer 28 and capacitor dielectric 26 without removing the vertical portions of those layers which line the vertical sidewalls of the vias 24. Such a process is known as "spacer etch" in the industry, and is well known. The spacer etch comprises a directional or anisotropic process, which can be purely physical (e.g., sputter etch) or have a chemical component (e.g., reactive ion etch or RIE). In either case, the process is selected to etch through the horizontal portions of the preferred conductive layer 28 (Pt) and capacitor dielectric 26 (BST).

In other arrangments, the spacer etch can be conducted upon the structure of FIG. 2, removing horizontal portions of the conductive layer 28 or the dielectric layer 26 from both the bottom of the vias 24 as well as overlying the structural layer 22. Such a sequence advantageously obviates the CMP discussed above with respect to FIG. 3.

Following the spacer etch, the exposed portions of the protective layer 20 (TEOS) are then removed to extend the vias 24 down to the polysilicon plug 18. This phase of the via extension is also preferably performed by a directional etch, and most preferably by RIE. The skilled artisan will recognize, however, that certain phases of the via extension can be performed by selective wet or vapor etch.

FIGS. 5a, 6a, 7a, and 8a represent the products of sequential steps in accordance with a first preferred embodiment. FIGS. 5b, 6b, 7b and 8b represent the products of corresponding steps in accordance with a second preferred embodiment. It is convenient to discuss corresponding steps and structures of the two embodiments together, such that the following description alternates between the two embodiments. Like reference numerals are used to refer to like elements throughout the discussion below.

Following the spacer etch, in both embodiments, a conductive layer is deposited over the structure of FIG. 4 and into the extended vias 24. In the first embodiment, shown in FIG. 5a, the vias are completely filled by a conductive material 30. In the second embodiment, illustrated in FIG. 5b, a conductive material 32 conformally lines the extended vias 24 and overlies the structural layer 22 in which the vias 24 are formed. Deposition of the conductive material 32 in the second embodiment is preferably followed by deposition of a filler material 34. In the illustrated embodiment, the filler material 34 comprises a form of silicon oxide, such that it can be deposited by CVD to completely fill the extended vias 24.

In either of the embodiments of FIGS. 5a and 5b, the second conductive layer 30 or 32 directly contacts the first conductive layer 28 and connects it to the underlying polysilicon plug 18, thereby electrically connecting the conductive layer 28 to the integrated devices of the substrate 10 below (see FIG. 1). Preferably, the conductive material 30 or 32 comprises an oxidation-resistant metal such as platinum. Also in both embodiments, the vias 24 are filled.

Figure 5A:
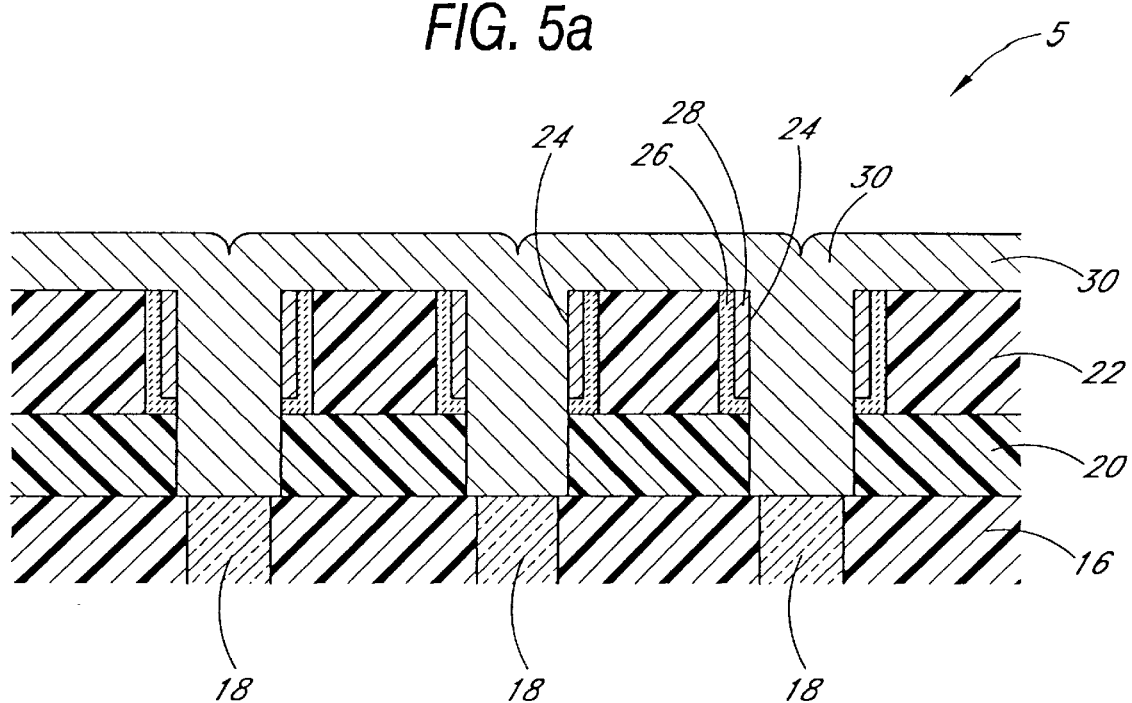
Figure 6A:
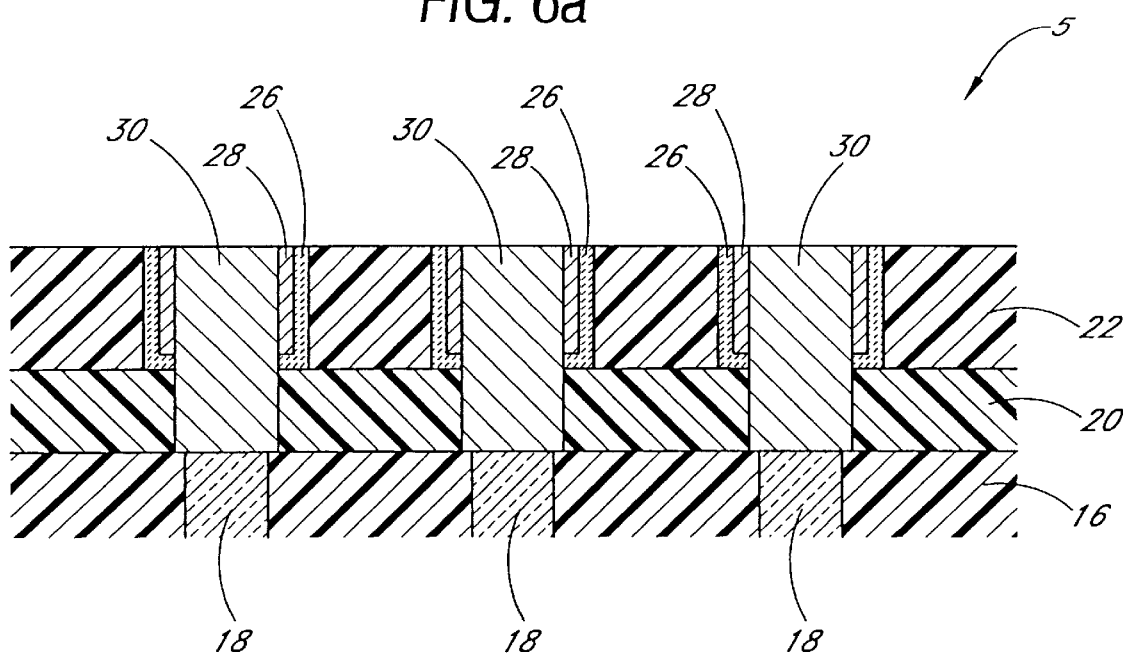

Referring now to FIG. 6a, in the first embodiment, the structure of FIG. 5a is shown after the portion of the conductive layer 30 overlying the structural layer 22 has been removed. In the illustrated embodiment, this removal is preferably accomplished by mechanically planarizing the partially fabricated circuit, and preferably by CMP. As with the process described with respect to FIG. 3, the substrate 10 is inverted over an abrasive pad which mechanically abrades the conductive layer 30, while a reactive slurry chemically aids the removal. As a result, a plurality of electrically isolated conductive structures 30 are left surrounded by the first conductive layer 28 and the high k dielectric 26. The skilled artisan can readily determine an effective slurry chemistry for aiding the removal of the conductive layer 30 while stopping the etch when the structural layer 22 is exposed.

Figure 5B:
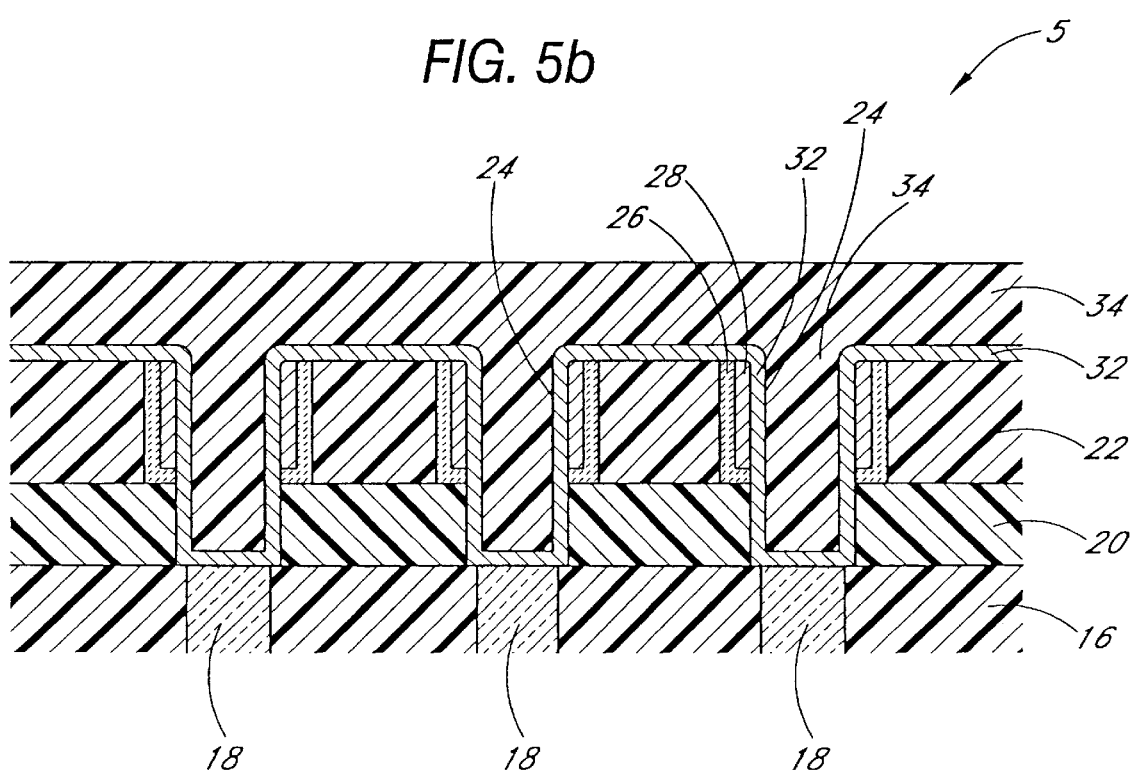
Figure 6B:
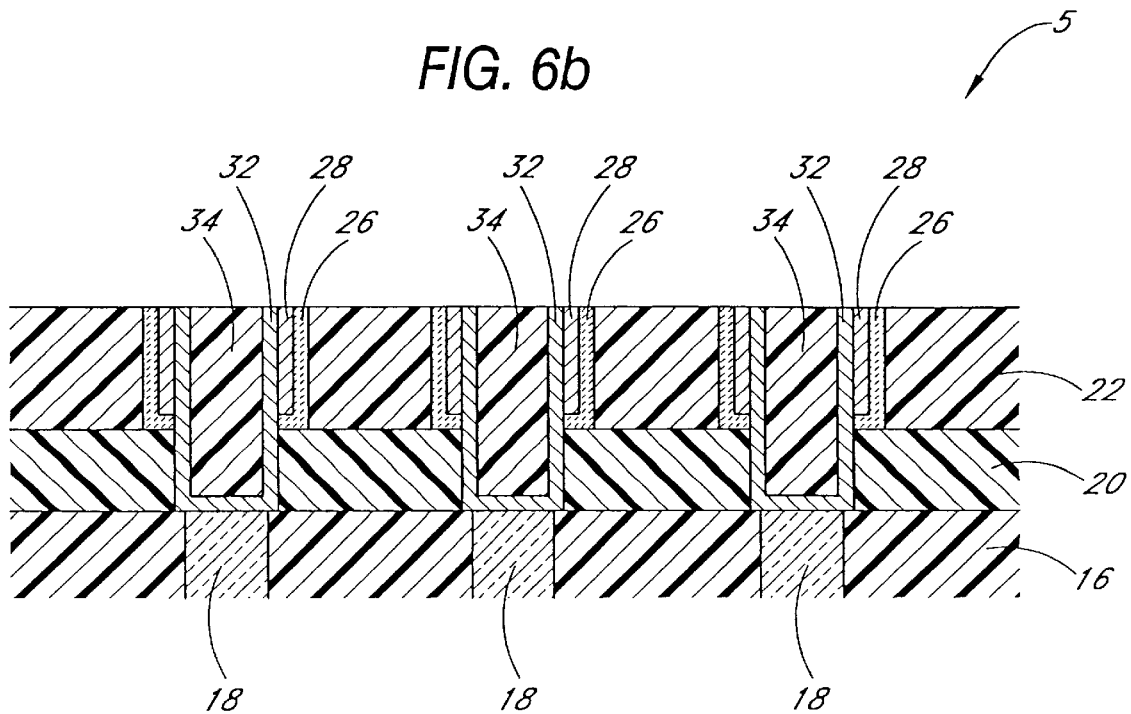

Similarly, with reference to FIG. 6b, in the second embodiment, the structure of FIG. 5b is shown after removal of portions of the filler material 34 and the conductive liner 32 which were overlying the structural layer 22. The removal in this second embodiment can also be accomplished by CMP, and also leaves isolated conductive structures 32 surrounded by the first conductive layer 28 and the high k dielectric 26.

Figure 7A:
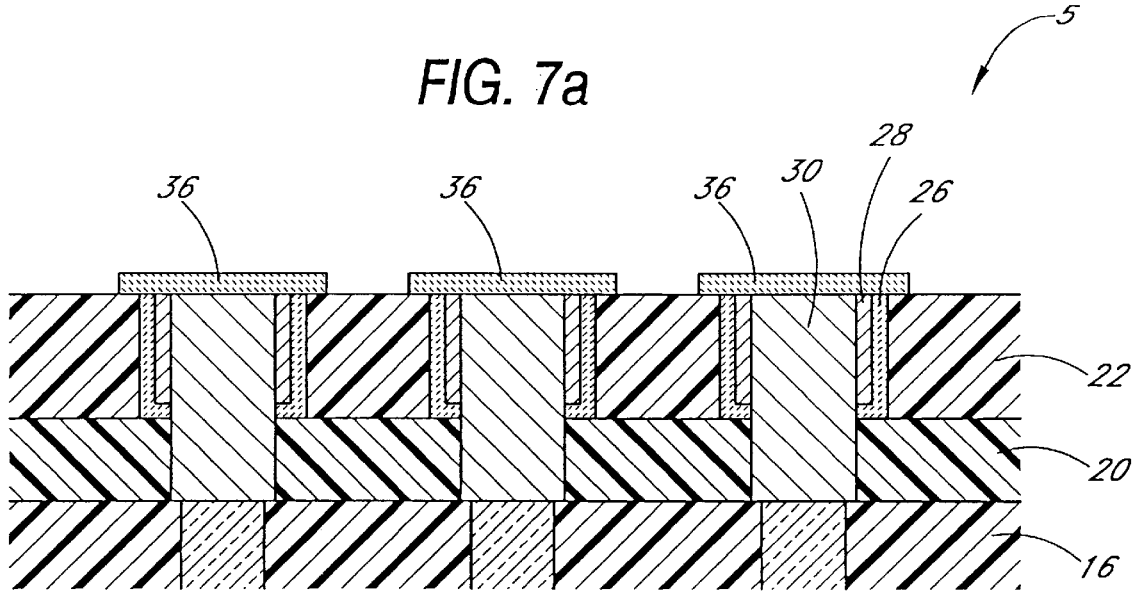

Referring now to FIG. 7a, the structure of FIG. 6a is shown after formation of a patterned cap layer 36. For example, an insulating layer can be deposited, followed by standard photolithographic masking and etching to leave patterned cap layers 36 over each filled via 24. Alternatively, it will be understood that such patterned cap layers can be formed without additional photolithographic masks by recessing the conductive layers 28, 30, depositing an insulating film over the structure, and planarizing the wafer to leave the cap layers covering the recessed conductive layers 28, 30.

The cap layer 36 serves to separate the capacitor storage or bottom electrode, represented in each via 24 by the remaining portions of the first conductive layer 28 and the second conductive layer 30, from the top electrode to be formed. Accordingly, the cap layer 36 comprises an insulating material. In the illustrated embodiment, the cap layer 36 comprises a high k material, and preferably comprises the same high k material as the dielectric layer 26. Thus, as will be better understood from FIG. 8a, the cap layer 36 contributes to the cell capacitance and essentially forms part of the capacitor dielectric.

Figure 7B:
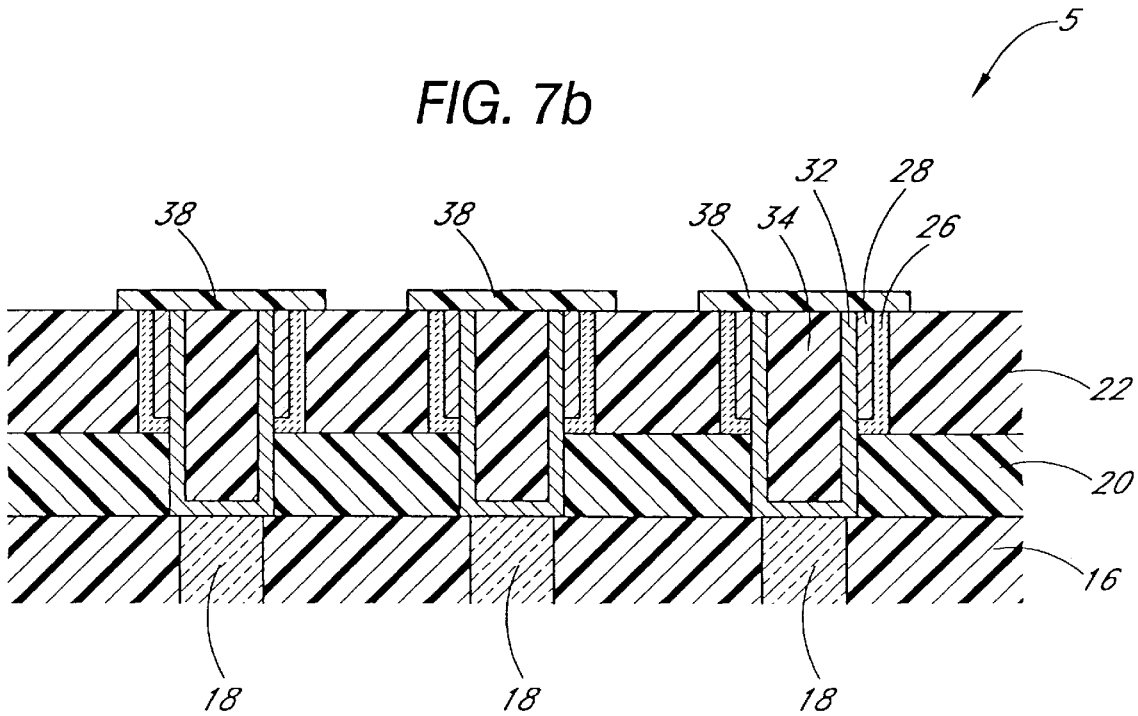

In accordance with the second embodiment, FIG. 7b shows a cap layer 38. Here, the cap layer 38 serves the same purpose as in the first embodiment, i.e., to keep the bottom electrode from shorting to the top electrode. Unlike the first embodiment, however, the majority of the via width is filled with the filler 34, which is a nonconductive material. The only portion of the bottom electrode which needs to be insulated from the top electrode (to be deposited) is the width of conductive layers 28 and 32. As this represents a very small surface area compared to the via sidewalls, the cap layer 38 will not contribute significantly to the cell capacitance regardless of the material used for the cap layer 38.

Thus, the cap layer 38 of the second embodiment can comprise a standard dielectric material which can be easily integrated into the process flow without risk of oxidizing the electrodes and polysilicon plug below. Preferably, the cap layer 38 comprises a material which can be selectively etched relative to the structural layer 22 (BPSG in the illustrated embodiments). The illustrated cap layer 38 comprises silicon nitride ($Si_3N_4$).

Figure 8A:
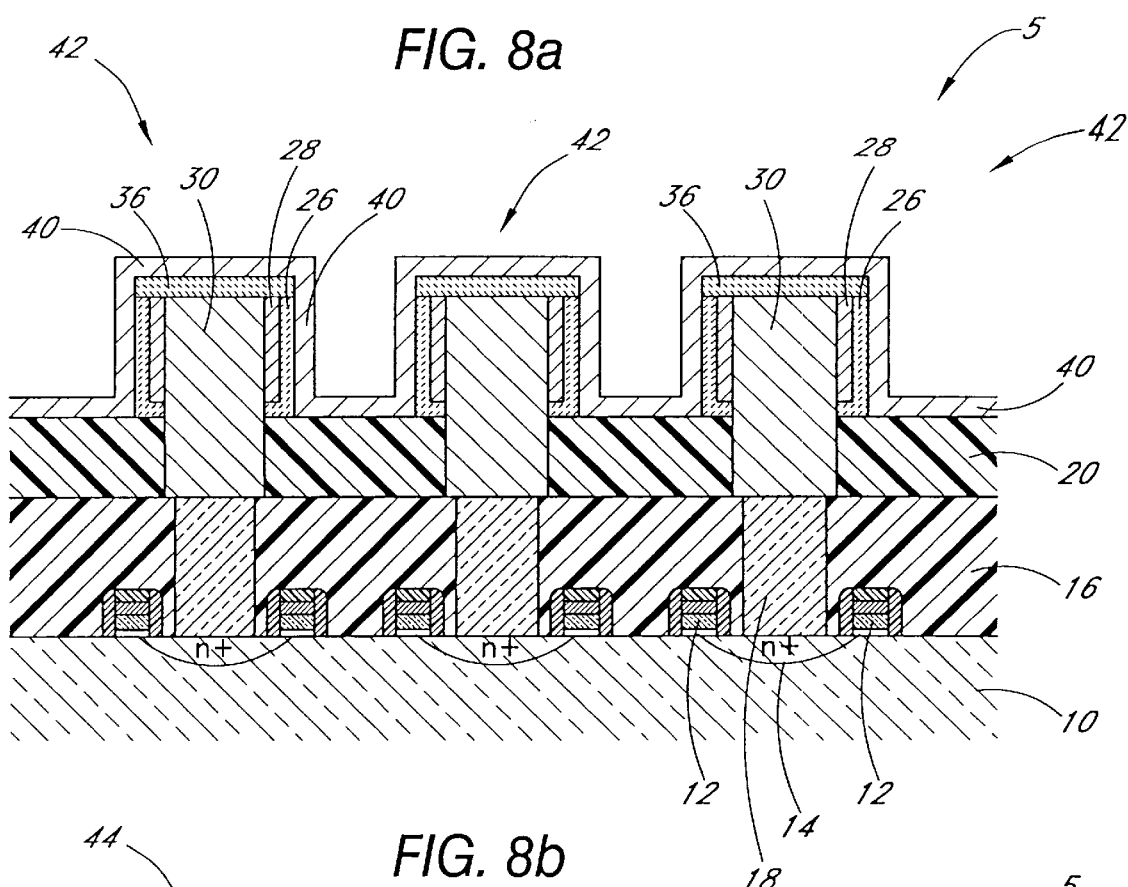

Returning to the first embodiment, FIG. 8a shows the structure of FIG. 7a after etching back the structural layer 22 and depositing a third conductive layer 40 to form the top electrode. The etch back preferably selectively removes the structural layer 22 without etching the cap layer 36 or the high k dielectric 26, and can be stopped on the underlying insulating layer 20. In accordance with the preferred materials set forth above, the BPSG of the illustrated structural layer 22 can be removed with an HF wet or vapor etch, without harming the cap layer 36 or the capacitor dielectric 26.

Optionally, a second anneal can be performed after the etch back, which can repair any damage to the BST capacitor layer 26 from the etching process. For example, plasma etch processes typically cause damage to complex oxide dielectrics, which can be reversed by anneal in an oxidizing environment (e.g., $O_2$ and $N_2O$ at 550° C.). Alternatively, the deposited BST can be etched back before any anneal is conducted. In still another alternative, the BST can be annealed after deposition of the conductive layer 40 is deposited, which deposition is discussed in the following paragraph. In summary, a curing anneal for the high k dielectric layer 26 can be conducted immediately after deposition; after isolation etch back; after formation of the top and bottom electrodes; or any combination of the above anneal times (i.e., several anneal steps can be performed).

After the etch back, outside vertical surfaces of the dielectric layer 26 are exposed. The third conductive layer 40 can then be deposited by conventional techniques. As with the first conductive layer 28 and the second conductive layer 30, the third conductive layer 40 preferably comprises a material resistant to oxidation, such as noble metals and conductive oxides. Preferably, the third conductive layer 40 also comprises platinum.

FIG. 8a thus illustrates a plurality of container-shaped memory cell capacitors 42 in accordance with the first preferred embodiment. The dielectric layer 26 of each capacitor 42 defines a container shape, lined with the first conductive layer 28. The first conductive layer 28 thus forms a concentric container, or container-shaped sidewall spacer on the inside surface of the dielectric layer 26. The second conductive layer 30 fills the container defined by the first conductive layer 28, and serves to electrically connect the first conductive layer 30 to the underlying circuit node, in this case by way of the polysilicon plug 18. The cap layer 36 defines an insulating lid over all three layers, while the third conductive layer 40 surrounds and directly contacts the outside surface of the dielectric layer 26, as well as the upper surface of the cap layer 36.

The first and second conductive layers 28, 30 thus together define the bottom or storage electrode of the memory cell capacitor 42; the dielectric layer 26 and cap layer 36 together define the capacitor dielectric, in the shape of a lidded container; and the third conductive layer 40 serves as the top or reference electrode. In the illustrated DRAM process flow, the third conductive layer 40 serves as a common reference electrode for an array of memory cells, such that the conductive layer 40 is not patterned, although it will be understood that the reference plates of multiple arrays across a memory chip will generally be isolated from one another. In summary, the capacitor dielectric 26, 36 is directly contacted by and sandwiched between the top or outer electrode 40 and the bottom or inner electrode 28, 30. Advantageously, the contacting surfaces of the electrodes and dielectric conform to a three-dimensional container shape, and thus represent a relatively high surface area compared to the footprint occupied over the substrate 10.

Figure 8B:
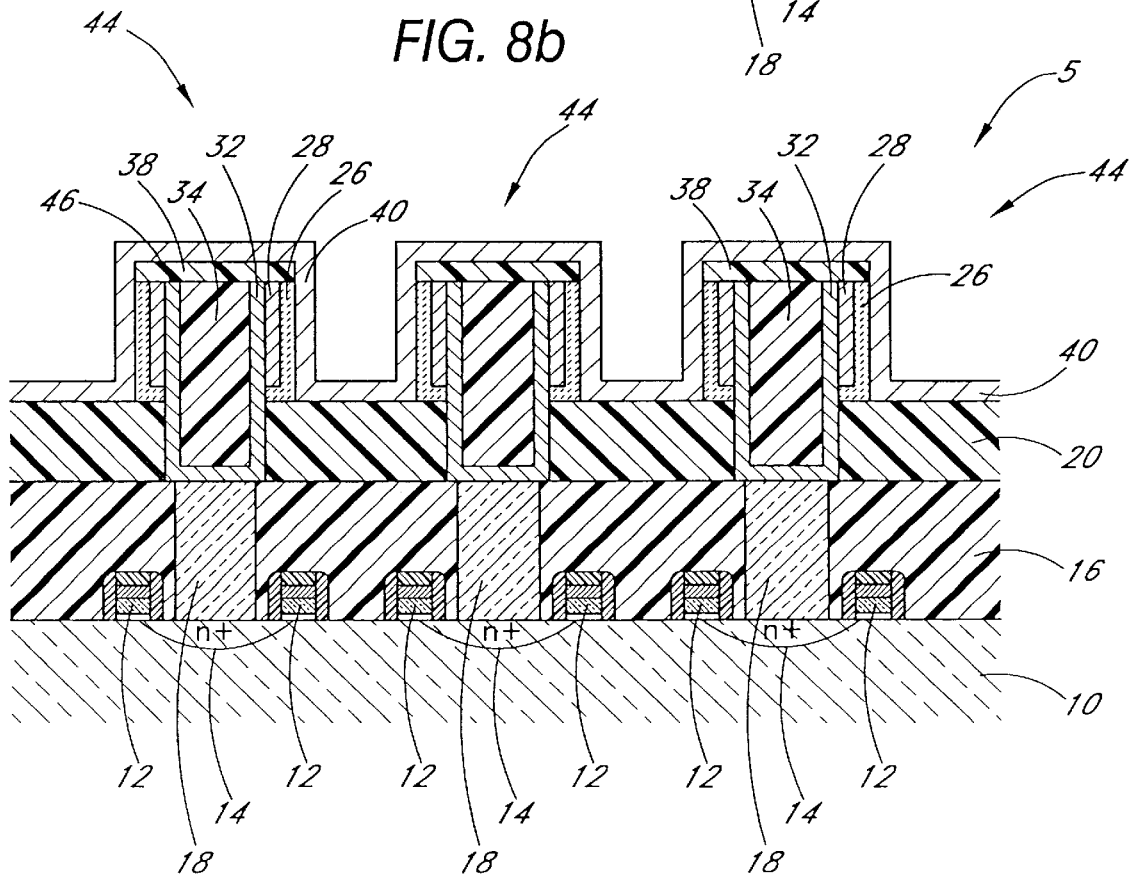

FIG. 8b shows the structure of FIG. 7b after etching back the structural layer 22, and deposition of a third conductive layer 40 to form the top electrode. These processes can be identical to that described above with respect to the first preferred embodiment, and is not repeated here.

A resulting capacitor structure 44 of the second embodiment differs somewhat, however, from that of the first embodiment. While the dielectric layer 26, first conductive layer 28 and third conductive layer 40 of the second embodiment are similar in shape and material to the corresponding elements of the first embodiment, the container defined by the first conductive layer 28 is lined with the conductive liner 32, which defines yet another concentric container. This container, in turn, is filled with the non-conductive filler 34.

Effectively, therefore, the bottom electrode of the capacitor 44 of the second embodiment consists of the first conductive layer 28, while the liner 32 serves primarily to electrically connect the bottom electrode to the underlying circuit node by way of the polysilicon plug 18. The filler 34 does not form part of the bottom electrode. The top edge 46 of the conductive liner 32 is electrically connected to the bottom electrode and portions of the cap layer 38 are sandwiched between this top edge 46 and the third conductive layer 40. Accordingly, the top edge 46 of the liner 32 (and the top edge of the adjacent first conductive layer 28) technically contribute to the overall capacitance. However, the preferred $Si_3N_4$ cap layer 38 has a much lower dielectric constant than the high k dielectric layer 26, and the surface area of the top edge 32 is small compared to the vertical sidewalls of the first conductive layer 26. Therefore, the liner 32 and cap layer 38 contribute negligibly to the overall capacitance of cell capacitor 44.

After the capacitors of either embodiment have been formed, the integrated circuit can be completed by a conventional DRAM process flow. Typically, an interlevel dielectric layer is formed over the illustrated capacitors 42 or 44, filling the valleys between capacitors 42 or 44. Metal layers are then formed above the ILD, including contacts formed through the ILD to electrically connect the wiring above to the capacitors 42 or 44, gate electrodes 12 and digit lines (not shown).

The preferred embodiments described above provide integrated circuit capacitors with high k dielectric materials for increased capacitance. At the same time, the illustrated method enables formation of the high k capacitor dielectric prior to formation of either top or bottom electrodes. Advantageously, this minimizes risk of oxidation of the electrodes themselves or the underlying conductive structures (e.g., poly plugs 18) during deposition or curing of the high k material. While the poly plug 18 has been previously formed, it is protected during high k dielectric formation by the insulating layer 20. In the illustrated embodiments, the insulating layer 20 comprises TEOS thick enough to prevent oxygen diffusion therethrough. Electrical contact to the poly plug 18 is formed after the high k dielectric has been formed and cured.

Although the foregoing invention has been described in terms of certain preferred embodiments, other embodiments will become apparent to those of ordinary skill in the art, in view of the disclosure herein. For example, while the first embodiment incorporates a high k dielectric material for the cap layer 36, and the second embodiment incorporates a conventional dielectric material for the cap layer 38, it will be understood that the converse arrangements are equally practicable. Additionally, while the preferred embodiments describe cylindrical capacitor configurations, the skilled artisan will find application for the principles disclosed herein to more simple or more complex three-dimensional capacitor designs. Accordingly, the present invention is not intended to be limited by the recitation of preferred embodiments, but is instead intended to be defined solely by reference to the appended claims.

We claim:

1. An integrated circuit including a capacitor structure above a semiconductor substrate, comprising:
    an oxidizable conductive plug extending from the substrate to a first level;
    an insulating protective layer having a thickness of at least about 500 Å above the first level;
    a container-shaped dielectric layer above the insulating protective layer;
    a first conductive layer lining an inside surface of the dielectric layer;
    a second conductive layer directly contacting the first conductive layer and extending through the protective layer to electrically contact the conductive plug; and
    a third conductive layer lining an outside surface of the dielectric layer and extending over a container shape defined by the dielectric layer.

2. The integrated circuit of claim 1, wherein the dielectric layer is characterized by a high dielectric constant.

3. The integrated circuit of claim 2, wherein the dielectric layer comprises a complex oxide.

4. The integrated circuit of claim 3, wherein the dielectric layer comprises barium strontium titanate.

5. The integrated circuit of claim 2, wherein the second conductive layer comprises an oxidation-resistant material.

6. The integrated circuit of claim 5, wherein the second conductive layer comprises a noble metal.

7. The integrated circuit of claim 6, wherein the second conductive layer comprises platinum.

8. The integrated circuit of claim 1, wherein further comprising a nonconductive filler filling an inner container defined by the second conductive layer.

9. The integrated circuit of claim 1, wherein the second conductive layer fills a container defined by the first conductive layer.

10. The integrated circuit of claim 1, further comprising an insulating cap layer extending over the dielectric layer, the first conductive layer and the second conductive layer, the third conductive layer extending over the cap layer.

11. A system including an integrated capacitor over a semiconductor substrate, comprising:

an oxidizable circuit node;

a capacitor dielectric layer characterized by a dielectric constant of greater than about 30;

a reference electrode directly contacting a first side of the dielectric layer and extending over the capacitor dielectric layer; and an oxidation-resistant conductive layer directly contacting a second side of the dielectric layer, the second side opposite the first side, the oxidation-resistant conductive layer further directly contacting the oxidizable circuit node.

12. The system of claim 11, wherein the oxidizable circuit node comprises a conductive plug extending from a transistor active area in the substrate.

13. The system of claim 12, wherein the conductive plug comprises polysilicon.

14. The system of claim 13, wherein the oxidation-resistant conductive layer comprises an oxygen-permeable metal.

15. The system of claim 14, wherein the oxidation-resistant conductive layer comprises a noble metal.

16. The system of claim 11, wherein the oxidation-resistant conductive layer comprises platinum.

17. The system of claim 11, wherein the dielectric layer is container-shaped, and the oxidation-resistant conductive layer lines an inner surface of dielectric layer.

18. The system of claim 17, wherein the oxidation-resistant conductive layer comprises a first conductor directly lining a major inner surface of the dielectric layer and a second conductor directly lining an inner surface of the first conductor and a minor inner surface of the dielectric layer.

19. The system of claim 18, wherein the second conductor comprises a conductive plug filling a container defined by the first conductor.

* * * * *